United States Patent
Kumar et al.

[11] Patent Number: 5,958,807
[45] Date of Patent: Sep. 28, 1999

[54] LOW DIELECTRIC LOSS GLASS CERAMIC COMPOSITIONS

[75] Inventors: Ananda Hosakere Kumar, Plainsboro; Barry Jay Thaler, Lawrenceville; Ashok Narayan Prabhu, East Windsor; Ellen Schwartz Tormey, Princeton Junction, all of N.J.

[73] Assignee: Sarnoff Corporation, Princeton, N.J.

[21] Appl. No.: 08/874,926

[22] Filed: Jul. 1, 1997

Related U.S. Application Data

[63] Continuation of application No. 08/379,266, Jan. 27, 1995, Pat. No. 5,854,150.

[51] Int. Cl.$^6$ .................................................. C03C 10/08
[52] U.S. Cl. ........................... 501/5; 501/9; 501/73; 501/75; 501/77
[58] Field of Search ................. 501/5, 9, 74, 75, 501/77, 73

[56] References Cited

U.S. PATENT DOCUMENTS

| | | | |
|---|---|---|---|
| 4,764,486 | 8/1988 | Ishihara et al. | 501/9 |
| 5,079,194 | 1/1992 | Jean et al. | 501/32 X |
| 5,099,174 | 3/1992 | Coxon et al. | 313/623 |
| 5,216,207 | 6/1993 | Prabhu et al. | 174/256 |
| 5,250,474 | 10/1993 | Siebers | 501/9 |
| 5,256,469 | 10/1993 | Cherukuri et al. | 428/210 |
| 5,277,724 | 1/1994 | Prabhu | 156/89 |
| 5,356,841 | 10/1994 | Mizutani et al. | 501/9 X |

FOREIGN PATENT DOCUMENTS

| | | | |
|---|---|---|---|
| 289222 | 11/1988 | European Pat. Off. | C03C 10/08 |
| 0351097 | 1/1990 | European Pat. Off. | |

OTHER PUBLICATIONS

Kondo et al, "Low Firing Temperature Ceramic Material for Multilayer Ceramic Substrates", Multilayer Ceramic Devices,Advances in Ceramics, vol. 19, pp. 77–87.

Primary Examiner—Karl Group
Attorney, Agent, or Firm—William J. Burke

[57] ABSTRACT

High magnesium-content magnesium aluminosilicate glasses are used to form green tape compositions that are fired stepwise, i.e., first to about 500° C. to remove organic materials, then to a temperature 10–30° C. above the glass transition temperature for a time sufficient to nucleate the glass, and finally to a higher temperature near but below the softening temperature to complete crystallization of the glass. The resultant glass-ceramic may include substantial amounts of the forsterite crystalline phase. Multilayer ceramic printed circuit boards are made that are useful for high frequency, microwave applications. The fired high magnesium oxide content glasses have low dielectric constant and low dissipation loss factors, and they have a thermal coefficient of expansion that is compatible with metal or ceramic support substrates that impart mechanical strength to the printed circuit boards and that are thermally conductive. The boards are compatible with gallium arsenide devices.

4 Claims, 2 Drawing Sheets

LOW DIELECTRIC LOSS GLASS CERAMIC COMPOSITIONS

This application is a continuation of application Ser. No. 08/379,266 filed on Jan. 27, 1995 now U.S. Pat No. 5,854, 150.

This invention was made with Government support under DAAB07-94-C-C009 awarded by the US Department of the Army. The Government has certain rights in this invention.

This invention relates to multilayer ceramic circuit boards and method of making them. More particularly, this invention relates to multilayer ceramic circuit boards made from glass/ceramics having moderate values for thermal expansion coefficient, low dielectric constant and very low dielectric loss values at frequencies in the gigahertz range.

BACKGROUND OF THE INVENTION

Multilayer ceramic circuit boards have been in use for several decades for high performance systems such as main frame computers. They are made by preparing a green tape composition from ceramic and glass powders that are mixed with an organic binder and cast. Via holes are punched in the formed tape and wiring patterns of conductive metals are screen printed onto the tapes. Conductive metal inks are also screen printed into the via holes to provide electrical interconnection between the circuit patterns of the various layers. The green tapes are stacked in proper alignment and pressed together so that the vias and wirings contact each other. The multilayer stack is then fired to burn off the polymeric binder and other organic materials, and to sinter the metal patterns and the ceramic layers. Thus ceramic substrates having several layers of interconnected integrated circuits are formed.

The choice of ceramic material determines the type of conductive metal that can be used to make the metal patterns. Ceramics such as alumina have a high sintering temperature, e.g., about 1500° C., and thus they require high melting refractory metal powders of molybdenum or tungsten to make the circuit patterns. More recently, low firing temperature glasses and glass and ceramic mixtures have been employed, which glasses sinter at fairly low temperatures, e.g., below about 1000° C. These glass and glass/ceramic mixtures permit the use of relatively low melting temperature metals that are more conductive than refractory metals, such as silver, gold, copper, their mixtures and alloys and the like. These low temperature ceramic substrates can be chosen to have a thermal coefficient of expansion closely matched to that of silicon, for example, and thus they have found use in circuit boards wherein silicon devices are directly bonded to the circuit boards using low melting solders or other adhesives.

Crystallizable glasses of the magnesium-aluminosilicate and lithium-aluminosilicate type have been used to make such low temperature co-fired ceramic substrates with thick film wiring patterns of conductive metals such as silver, gold or copper. Glass-ceramic insulator substrates have a low dielectric constant, which decreases the signal propagation delay in high speed digital computers, have a low resistivity to the metal conductors, and a close coefficient of thermal expansion (CTE) match to silicon which increases the reliability of solder interconnections. However, these glass/glass ceramic substrates are not as strong as alumina, and their thermal conductivity is significantly lower than that of alumina.

Another disadvantage for both alumina and glass or glass/ceramic substrates is that they shrink during firing, in all directions, which leads to problems of distortion of the layers and consequent distortion of the circuit patterns.

To overcome problems of low strength, laminated green tape stacks have been fired on prepared metal plates. These metal plates preferably contain a mechanically strong core material, such as molybdenum, tungsten, Kovar, Invar and the like, which can be plated or laminated with a layer of highly conductive metal such as copper to provide enhanced thermal conductivity. The green tape layers are stacked onto the metal plate and fired, whereupon the glass layers adhere to the metal plate. This suppresses shrinkage at least in the lateral x and y directions, with the result that all of the shrinkage occurs only in the thickness, or z, direction. This elimination of lateral shrinkage prevents distortion, warpage, and dimensional problems that adversely affect the yield of good devices. The metal plate or support substrate provides both mechanical strength and heat sinking capabilities for the ceramic multilayer circuit boards. In using this technique however, it is imperative that the coefficient of thermal expansion of the glass-ceramics be matched to that of the chosen support substrate to prevent cambering or cracking of the resulting composite substrate.

Suitable materials for fabricating low temperature ceramic substrates, particularly metal supported ceramic circuit boards, include cryatallizable glasses or mixtures of glass and ceramic capable of being sintered at temperatures below 1000° C. The initial glass composition is chosen so that it undergoes complete densification and crystallization on firing to yield glass-ceramics of the required thermal, electrical and mechanical properties. The crystallization behavior of these glasses is dependent on many factors, such as their composition, their thermal history and the particle size of the starting glass powder. When mixtures of glass and ceramic are used, the softening of the glass phase at elevated temperatures leads to densification with little or no crystallization. Here the properties of the resulting ceramic can be predicted from those of the starting materials and their known proportions in the ceramic.

Up till now, the primary factors governing the choice of the dielectric composition of low temperature ceramic substrates have been the need for a low dielectric constant, which reduces the signal propagation delays in high speed digital applications, and the need for closely matching the coefficients of thermal expansion of the ceramic substrate with silicon; this enhances the reliability of direct solder interconnections between a silicon integrated circuit chip and the ceramic substrate.

Crystallizable glasses in the magnesium-aluminosilicate system, particularly those glasses having a cordierite crystalline phase, have been chosen in the past because of the known low CTE of the cordierite crystalline phase and its low dielectric constant. Stoichiometric cordierite compositions, however, do not sinter well at temperatures below 1000° C. Also, they possess an unacceptably low coefficient of thermal expansion, in the range of 7–10×10–7/° C.

To improve the sinterability and to increase the CTE of the resulting glass-ceramics, compositions rich in magnesia content, but still lying entirely in the cordierite crystalline phase, were selected by Kumar at al, see U.S. Pat. No. 4,301,324. These compositions were formulated to yield substrates having a CTE in the range of 20–40×10–7/° C., bracketing the CTE of silicon.

Kondo et al, "Low Firing Temperature Ceramic Material for Multilayer Substrates", Multilayer Ceramic Devices, Advances in Ceramics, Vol. 19, have taught modified cordierite glass compositions containing additions of zinc oxide to improve sinterability and to increase the CTE to 24×10−7/° C., still matching that of silicon. These compositions either lie entirely in the cordierite crystalline phase field or in the mullite crystalline phase field of the magnesium oxide-aluminosilicate ternary phase system. Holleran et al, "Glass Ceramics for Electronic Packaging", European Patent Application No. 0 289 222 A1 (1988) added certain alkali and alkaline earth oxides to magnesium oxide-aluminosilicate cordierite compositions to achieve the same result.

The predominant crystalline phase in the cordierite glass-ceramics of the prior art have been determined to be alpha cordierite, with enstatite, $MgSiO_3$, as a secondary phase. Minor crystalline phases formed from the other additives to the glass compositions, and the residual glass, make up the glass-ceramic structure. FIG. 1 is a phase diagram of the ternary $MgO—Al_2O_3—SiO_2$ system illustrating various possible glasses and their crystalline phase fields. The cordierite-type glasses are marked as "A".

While the above prior art compositions are suitable for fabricating free standing, co-fired, multilayer substrates, they cannot be employed with known support substrates which can be made of Kovar, Invar and the like, or composites such as of copper-molybdenum-copper, copper-tungsten-copper, copper/Kovar/copper, copper/Invar/copper and the like, or support substrates of ceramic materials such as aluminum nitride, silicon carbide and the like, all of which support substrates have a CTE in the range of 30–65×10−7/° C.

It would be desirable to develop glass compositions that would be suitable for fabrication of such composite structures. The dielectric glass-ceramic must adhere well to the chosen support plate, and to the thick film conductors used to form the circuit patterns and via interconnections between the circuits.

Another goal of this invention is to fabricate ceramic substrate structures having a CTE matched to gallium arsenide (GaAs) devices. Such devices are widely used for microwave applications. These glass-ceramic substrates are required to have a low dielectric constant, and very low dielectric losses in the microwave frequency range. Suitably dielectric constant is in the range of 5–7. The dielectric loss, characterized as tan $\partial$, should be less than or equal to $2\times10^{-3}$.

Thus it would be highly desirable to obtain dielectric materials that would be suitable as insulators for conductors carrying high frequency digital or microwave signals having low dielectric loss factors and low dielectric constant, and also having a thermal coefficient of expansion that is compatible with metal substrates, particularly the copper coated composite substrates described above with ceramic substrates, and with gallium arsenide, which is widely used to make microwave devices. The prior art magnesium-aluminosilicate, cordierite-based glasses have some properties that are of interest, e.g., their ability to sinter to form pore-free material, their low sintering temperatures, their high rupture strength, their good resistance to chemicals used in plating, and their superior surface finish. However, cordierite glasses do not have a CTE compatible with metal or ceramic support substrates, nor to gallium arsenide.

SUMMARY OF THE INVENTION

We have found that glasses having compositions that lie in the forsterite crystalline phase field of the magnesium oxide-aluminosilicate ternary system can form green tapes that, when fired, exhibit good sintering at temperatures below 1000° C.; that adhere well to support substrates; that possess a good CTE match to the metal or ceramic support substrate; and that are characterized by a low dielectric constant, and low dielectric loss characteristics.

Further, we have found that when the green tapes containing these glasses are heated stepwise, first to a temperature of about 10–30° C. above the glass transition temperature of the glass where they are held to permit nucleation throughout the glass, and then to an increased temperature to complete the crystallization of the glass, low dielectric loss values are achieved for the glass.

The present glasses are high magnesium-content magnesium-aluminosilicate glasses that have a low dielectric constant, i.e., below 6, very low dissipation factors (tan $\partial < 2\times10^{-3}$) at GHz frequencies, and thermal coefficient of expansion values in the range of $45–60\times10^{-7}/°$ C. to provide a thermal coefficient of expansion match to gallium arsenide (GaAs) devices and to support substrates as described above.

DETAILED DESCRIPTION OF THE INVENTION

The glasses of the present invention are $MgO—Al_2O_3—SiO_2$ glasses containing at least 26% by weight of MgO, and can optionally contain other metal oxides for specific properties. The high MgO content of these glasses aids in forming glasses having a high TCE, a low dielectric loss, improved sintering and good surface finish. The inclusion of additional oxides, such as lead oxide (PbO) or barium oxide (BaO), can improve bonding to a particular support substrate, for example, and lowers the dissipation factor.

The glasses of the invention are made by admixing and melting together appropriate metal oxide powders in the required amounts. The oxides used to make the glasses of the present invention include magnesium oxide in an amount of at least 26% by weight of the oxides.

When the ceramics are to be matched to copper clad composite substrates, such as Cu/Mo/Cu, Cu/Invar/Cu or Cu/Kovar/Cu for example, glasses having the composition, in addition to MgO, of silicon oxide in amounts of about 45–52% by weight of the oxides; minor amounts of oxides including phosphorous pentoxide, $P_2O_5$, boron oxide, $B_2O_3$, lead oxide, PbO, and zirconium oxide, $ZrO_2$, the balance being aluminum oxide, $Al_2C_3$, can be used.

When the ceramics are to be matched to a support substrate of a metal such as Kovar for example, glasses containing comparatively large amounts of barium oxide are added. Representative suitable glasses have the composition 26–34% by weight of MgO, 12–18% by weight of BaO, 5–20% by weight of $Al_2O_3$, 20–26% by weight of $SiO_2$, 10–16% by weight of boron oxide, $B_2O_3$, and minor amounts of additional oxides.

The oxides are melted together at a temperature in the range of 1500–1650° C. and quenched to form a glass. The glass is crushed in a ball mill to obtain a fine powdered glass. The glass powder is then admixed with conventional binders, plasticizers and surfactants to form a green tape composition. Several green tape layers are stacked together and pressed at a pressure of about 1500 psi at 90° C. in a platen press to form a green tape laminate. In accordance with the present process, the green tape laminate is fired in three steps; first to a temperature of about 500° C. where it is held for about an hour to permit the organic materials to burn off; then the temperature is increased to a temperature about 10–30° C. higher than the glass transition temperature of the glass and held for another 30–120 minute period to permit complete nucleation of the glass: and lastly the temperature was increased to a temperature near the softening point of the glass for another 30–120 minute period to complete the crystallization of the glass. The glass transition temperature and the crystallization temperature of a particular glass can be determined using conventional differential thermal analysis. This crystallization step is important to ensure a low dielectric constant and low dissipation loss values for the glasses.

Figure 1:
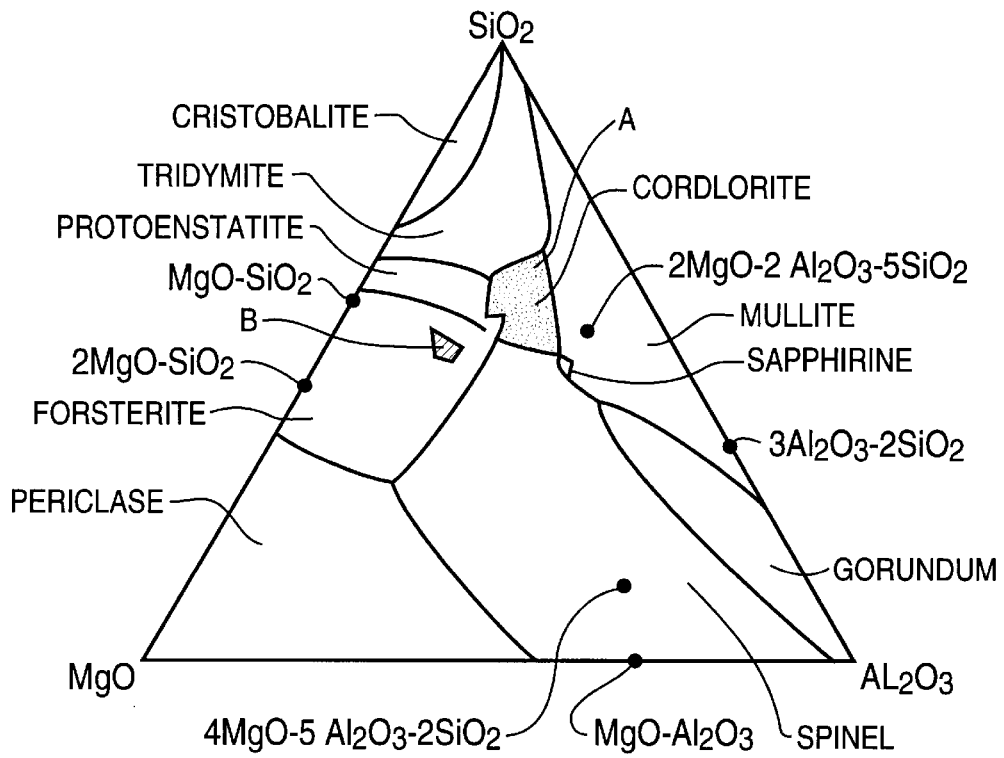
FIG. 1 is a ternary phase diagram of the magnesium oxide-alumina-silicon oxide system, showing the location of the present and prior art compositions.

We have determined that the glasses of the present invention useful for use with composite support substrates lie in the following composition range, within the forsterite crystalline phase field of the magnesium oxide-aluminosilicate ternary system, see FIG. 1 area marked "B": from about 26–35 percent by weight of magnesium oxide; from about 10–25 percent by weight of aluminum oxide; from about 45–52 percent by weight of silicon oxide, and up to 10 percent by weight of modifying oxides including boron oxide, phosphorus pentoxide, zirconia, lead oxide, alkali metal oxides, alkaline earth metal oxides and the like.

Glasses of the present invention preferred for use with metal support substrates such as Kovar have the following composition range: from about 26–34 percent by weight of magnesium oxide; from about 12–18 percent by weight of barium oxide; from about 5–20 percent by weight of aluminum oxide; from about 20–26 percent by weight of silicon oxide; from about 10–16 percent by weight of boron oxide; from about 1–3 percent by weight of zirconium oxide; and up to about 2 percent by weight of phosphorus pentoxide.

The glasses of the present invention, after firing in accordance with the above-described sequence of firing steps, contain two major crystalline phases, alpha-cordierite and forsterite ($Mg_2SiO_4$). Forsterite glasses have a higher TCE than cordierite, but are not as strong as cordierite, and thus they have not been of interest in making ceramic multilayer circuit boards up to the present time. However, because they are employed herein in multilayer ceramic circuits supported on a mechanically strong support substrate, the strength of the glass is not important. The higher CTE is also highly desirable for the present application, which employs high CTE support substrates, and requires a CTE match to gallium arsenide rather than to silicon.

The invention will be further described in the following examples, but the invention is not meant to be limited to the details described therein.

EXAMPLE 1

A glass was formed from the following oxides, in percent by weight:

| $SiO_2$ | $Al_2O_3$ | MgO | $P_2O_5$ | $B_2O_3$ | $ZrO_2$ |
|---|---|---|---|---|---|
| 45 | 22 | 29 | 1.5 | 1.0 | 1.5 |

Figure 2:
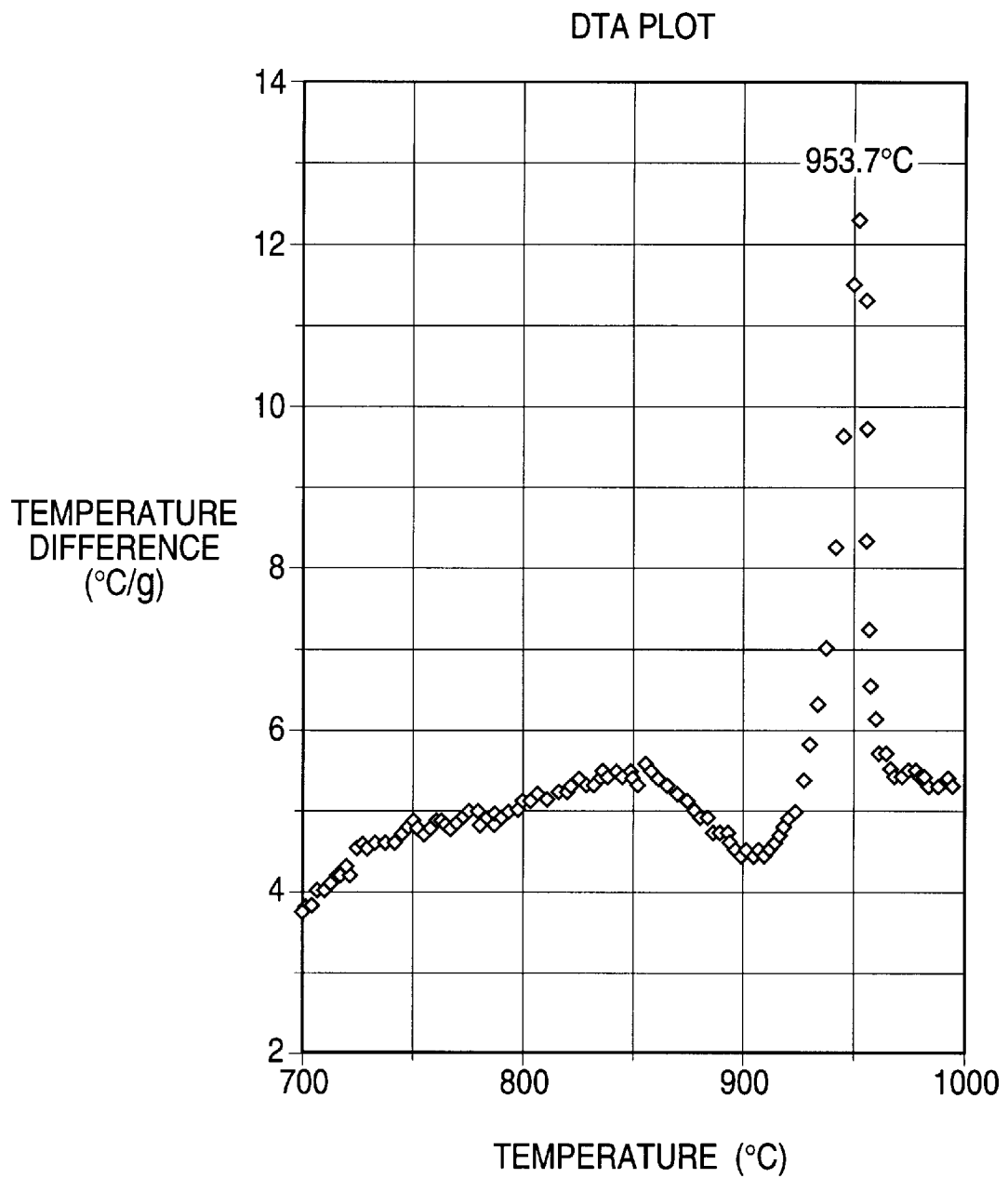
FIG. 2 is a differential thermal analysis curve for a glass useful in the present invention.

The above glass was ground to a particle size having an average of 7.5 microns. A differential thermal analysis curve for this glass is shown in FIG. 2. The graph shows the glass had a glass transition temperature of 875° and has a nucleation range of 880–915° C. The peak sintering temperature is 960° C.

The powdered glass was formed into a green tape slurry by adding conventional binders, surfactants, plasticizers and solvent and cast into a green tape using a doctor blade in known manner. Several layers of green tape were pressed together at about 1500 psi at 90° C. in a platen press to form a green tape laminate. The green tape laminate was heated in air in a furnace, first at 500° C. for one hour, at 900° C. (about 25° C. higher than the glass transition temperature) for one hour and at 925° C. for one hour.

The above sintered glass had a CTE of $45 \times 10^{-7}$/° C.; a dielectric constant of 5.7; and a dielectric loss, $\tan \partial \times 10^3$, of 1.6.

A sample of the same green tape laminate was fired by heating the same green tape composition at 900° C. for one hour (Control A).

The CTE and dielectric properties of the Example 1 and Control A glasses were compared and are summarized below:

| | Example 1 | Control A |
|---|---|---|
| CTE (RT-300° C.) × $10^{-7}$/°C. | 45 | 56 |
| Dielectric constant (15 GHz) | 5.7 | 6.9 |
| Dielectric loss (15 GHz) × $10^3$ | 1.6 | 12.7 |
| Porosity | <1% | <1% |
| Crystallinity | 95% | 10% |

Thus the glass-ceramic formed in accordance with the three step process of the invention had a higher temperature of firing, but lower values for thermal expansion coefficient, dielectric constant and dielectric loss.

When the Control A glass was reheated to 925° C. and held for one hour and then cooled to room temperature, the properties and microstructure of Control A became similar to the glass of Example 1, illustrating that the two step heating process affects the properties of interest in the present invention.

EXAMPLES 2–4

A summary of the compositions of additional glasses that can be formed in accordance with the present invention and that have properties and compositions similar to those of Example 1 are as follows:

| | Docket No. DSRC 11583 | | |
|---|---|---|---|
| | Glass 2 | Glass 3 | Glass 4 |
| $SiO_2$ | 45 | 50 | 51 |
| $Al_2O_3$ | 22 | 13 | 13 |
| MgO | 26 | 34 | 32 |
| $P_2O_3$ | 1.5 | | |
| $B_2O_3$ | 1.5 | 3 | 1 |
| PbO | 4.0 | | 3 |

The properties of the above glasses sintered at 925° C. are given below:

| | | | |
|---|---|---|---|
| CTE (× 10⁻⁷/° C. | 47 | 50 | 52 |
| Dielectric Constant | 5.7 | 6.1 | 6.1 |
| Tan ∂ (× 10³) | 2.1 | 1.9 | 1.75 |

The above glass compositions can be used to form both low temperature conventional multilayer circuit boards, or the green tape laminates can be mounted on a suitable metal or ceramic support substrate. These glasses are admirably suited to the use of silver thick film inks and via fill inks, comprising a glass powder of the invention, powdered conductive silver metal, and sufficient solvent and other conventional ingredients so that the ink can be screen printed onto the cast green tapes.

Microwave strip lines and other thin film structures can be fabricated onto fired and polished surfaces of the present glass-ceramic substrates by conventional thin film methods including vacuum deposition, sputtering, plating, lithography and etching processes.

Figure 3:
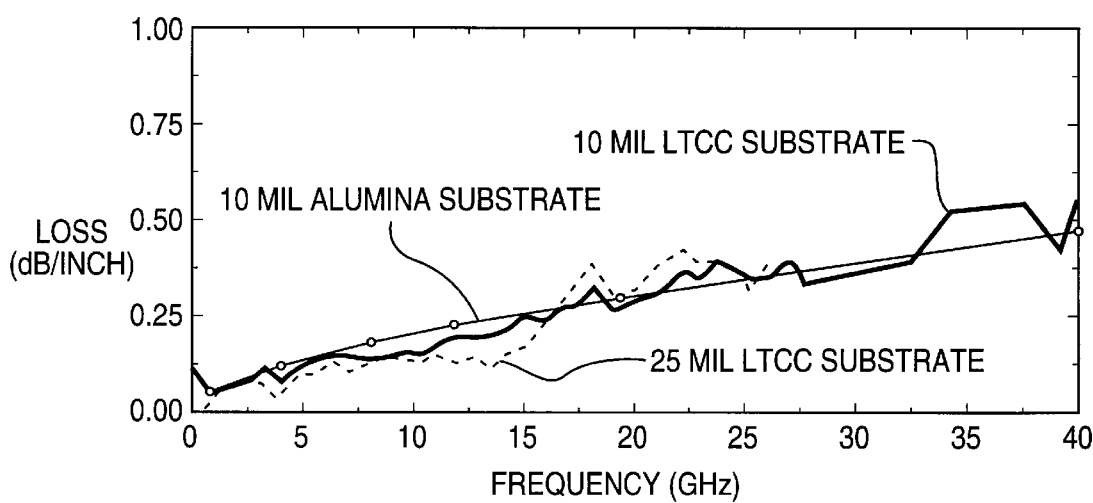
FIG. 3 is a graph of loss/inch versus frequency (in gigahertz) in a 50 ohm transmission line of a glass of the present invention.

The signal loss characteristics were measured at frequencies up to 40 GHz and compared to alumina. The results are shown in FIG. 3. The present glass-ceramics compare well with alumina over this range, and are very low compared to other known magnesium aluminosilicate glass-ceramics.

The temperature of crystallization of the present high MgO content magnesium aluminosilicate glasses can be changed somewhat by the addition of about 1–10% by weight of crystallized cordierite to the green tape compositions of the invention.

EXAMPLE 5

Crystalline cordierite powder (2.0% by weight) was added to the glass powder of Example 1 in the slurry used to form a green tape. The resultant composition, when sintered at 900° C. had the sama TCE and dielectric characteristics as those of Example 1 when fired at 925° C. Thus the addition of small amounts of crystalline cordierite lowers the peak crystallization temperature of the glass, in this Example from 970° C. to 937° C. The lower sintering temperature reduces the danger of local melting of silver conductors.

The resulting glass-ceramic had nearly the same values for CTE, dielectric constant and dissipation factor as the glass-ceramic of Example 1.

EXAMPLE 6

A green tape laminate was formed by pressing together, at a pressure of 1500 lb/in² and a temperature of 90° C., ten separate pieces of green tape containing the glass powder of Example 1 in a lamination press. The resulting laminate was placed on a suitably prepared copper-molybdenum-copper support substrate of similar size and 0.020 inch in thickness, and the laminate and the support pressed together at a pressure of less than 500 lb/in² at room temperature. The composite was heated gradually in a belt furnace to a peak firing temperature of 925° C. in air. After cooling to room temperature, a composite substrate comprising the monolithic sintered glass-ceramic laminate well adhered to the support substrate was obtained. The laminate did not shrink in the x and y directions during sintering, but had shrunk about 45% in the thickness direction.

Control B

The procedure of Example 6 was followed, but substituting green tape layers comprising a glass powder of a prior art composition lying in the cordierite crystalline phase of the magnesium oxide-aluminosilicate ternary system. This glass contained 22 weight percent of MgO; 25 percent by weight of $Al_2O_3$; 50 weight percent of $SiO_2$; 1.5 weight percent of $B_2O_3$ and 1.5 weight percent of $P_2O_5$. The CTE of this glass-ceramic is 34×10⁻⁷/° C. After firing, a severely warped composite structure was obtained wherein the glass-ceramic exhibited many cracks due to the tensile stress induced in it by the metal plate due to the large incompatibility of the respective CTEs of the glass-ceramic and the support substrate.

EXAMPLES 7–9

Since certain metal support substrates, such as Kovar, exhibit a sharp increase in its thermal expansion coefficient above about 300° C., additional high magnesium oxide content glasses can be used for bonding to metals such an Kovar. The compositions are given in the Table below:

| Weight % | Example 7 | Example 8 | Example 9 |
|---|---|---|---|
| MgO | 32.5 | 34 | 29 |
| BaO | 17 | 15 | 18 |
| $Al_2O_3$ | 7 | 6.5 | 8 |
| $SiO_2$ | 24 | 25 | 26 |
| $B_2O_3$ | 16 | 16 | 15 |
| $ZrO_2$ | 2.5 | 2.5 | 3 |
| $P_2O_5$ | 1 | 1 | 1 |

EXAMPLE 10

A green tape laminate was formed by pressing together in a laminating press at a pressure of 1500 psi and a temperature of 90° C., ten green tapes containing the glass powder of Example 7. The resulting laminate was placed on a suitably prepared Kovar support substrate 0.020 inch thick. The green tape laminate and the Kovar support were pressed together at a pressure of 500 psi at room temperature. The composite was then heated in a belt furnace to a peak temperature of 900° C. in air.

After cooling to room temperature, a composite substrate comprising a sintered glass-ceramic well adhered to the Kovar support was obtained. The laminate did not shrink in the x and y directions, but did shrink about 45.5% in the thickness direction. No bow or camber was apparent in the composite. Thus the thermal contraction coefficients of the glass-ceramic and the Kovar support were closely matched.

Although the present invention has been described in terms of particular embodiments, one skilled in the art can make various substitutions of compositions and reaction conditions, which are meant to be included herein. The scope of the invention is meant only to be limited by the scope of the appended claims.

We claim:

1. A fired glass ceramic composition having forsterite and cordierite crystalline phases containing at least 26 percent of magnesium oxide, and including an amount up to 10 percent by weight of a modifying oxide selected from the group consisting of boron oxide, phosphorus pentoxide, zirconia, lead oxide, alkali metal oxides, and alkaline earth metal oxides, said fired glass ceramic composition having a dielectric constant below 6, a dissipation factor below $2(\tan \times 10^{-3})$ and a thermal coefficient of expansion of 45–60×10⁻⁷/° C.

2. A fired glass composition according to claim 1 comprising at least 26 percent up to 35 percent by weight of magnesium oxide, from about 45–52 percent by weight of silicon oxide and from about 10–25 percent by weight of aluminum oxide.

3. A fired glass ceramic composition having forsterite and cordierite crystalline phases comprising at least 26 percent by weight of magnesium oxide, from about 12–18 percent by weight of barium oxide, from 5–20 percent by weight aluminum oxide, from about 20–26 percent by weight of silicon oxide and from about 10–16 percent by weight of boron oxide, said fired glass ceramic composition having a dielectric constant below 6, a dissipation factor below 2(tan $\times 10^{-3}$) and a thermal coefficient of expansion of $45-60 \times 10^{-7}$ /°C.

4. A fired glass ceramic composition according to claim 3 additionally containing up to 10 percent by weight of a modifying oxide selected from one or more of the group consisting of zirconium oxides, phosphorus pentoxide, and lead oxide.

* * * * *